US010333579B1

(12) United States Patent
Emira et al.

(10) Patent No.: US 10,333,579 B1
(45) Date of Patent: Jun. 25, 2019

(54) MULTI-MODE CONFIGURABLE TRANSCEIVER WITH LOW VOLTAGE SWITCHES

(71) Applicant: GOODIX TECHNOLOGY INC., San Diego, CA (US)

(72) Inventors: Ahmed Emira, San Diego, CA (US); Rami Khatib, San Diego, CA (US); Janakan Sivasubramaniam, San Diego, CA (US); Jared Gagne, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 15/952,228

(22) Filed: Apr. 12, 2018

(51) Int. Cl.
*H04B 1/40* (2015.01)
*H04B 1/44* (2006.01)
*H03K 17/687* (2006.01)

(52) U.S. Cl.
CPC ............. *H04B 1/44* (2013.01); *H03K 17/687* (2013.01)

(58) Field of Classification Search
CPC ............... H04B 1/40; H04B 1/00; H04B 1/44
See application file for complete search history.

(56) References Cited

U.S. PATENT DOCUMENTS

| | | | | |
|---|---|---|---|---|
| 7,944,296 B1* | 5/2011 | Lee | ........................ | H03F 1/0277 330/154 |
| 8,107,906 B2* | 1/2012 | Lum | ..................... | H04B 7/0845 375/346 |
| 8,165,535 B2* | 4/2012 | Ahn | ......................... | H04B 1/48 343/876 |
| 8,624,658 B1* | 1/2014 | Jones | .................... | H03D 7/1441 327/355 |
| 9,614,574 B2 | 4/2017 | Maimon et al. | | |
| 10,038,508 B1* | 7/2018 | Kerselaers | ............. | H04B 17/23 |
| 10,097,171 B2* | 10/2018 | Li | ......................... | H03K 17/687 |
| 2006/0232358 A1* | 10/2006 | Jedeloo | ..................... | H01P 1/15 333/103 |
| 2007/0281629 A1* | 12/2007 | Ahn | ......................... | H04B 1/48 455/78 |
| 2008/0299913 A1* | 12/2008 | Han | ......................... | H04B 1/48 455/83 |

(Continued)

OTHER PUBLICATIONS

International Search Report dated Jan. 4, 2019 in the corresponding PCT application (application No. PCT/CN2018/100179).

*Primary Examiner* — Cindy Trandai
(74) *Attorney, Agent, or Firm* — Kilpatrick Townsend & Stockton, LLP

(57) ABSTRACT

A wireless transceiver includes a receive path having a first switch and configured to receive an input signal when the first switch is in an open position, a first transmit path having a second switch and configured to provide a first output signal when the second switch is in a closed position and the first switch is in a closed position, and a second transmit path having a third switch and configured to provide a second output signal when the third switch is in a closed position, the first switch is in the closed position, and the second switch is in an open position. The first, second, and third switches are integrated together with the receive path, the first RF transmit path, and the second transmit path within a same integrated circuit.

20 Claims, 8 Drawing Sheets

(56) References Cited

U.S. PATENT DOCUMENTS

| | | | |
|---|---|---|---|
| 2009/0029733 A1* | 1/2009 | Schilling | H04M 1/6058 |
| | | | 455/557 |
| 2009/0036065 A1 | 2/2009 | Siu | |
| 2009/0253384 A1* | 10/2009 | Gorbachov | H04B 1/44 |
| | | | 455/83 |
| 2009/0289721 A1* | 11/2009 | Rajendran | H03F 3/195 |
| | | | 330/301 |
| 2010/0040178 A1* | 2/2010 | Sutton | H04B 7/0845 |
| | | | 375/345 |
| 2011/0195675 A1 | 8/2011 | Nitsche | |
| 2011/0273355 A1* | 11/2011 | Ahn | H01Q 21/50 |
| | | | 343/860 |
| 2012/0295559 A1* | 11/2012 | Kwok | H04B 1/48 |
| | | | 455/83 |
| 2014/0015731 A1* | 1/2014 | Khlat | H01H 1/0036 |
| | | | 343/876 |
| 2014/0043203 A1* | 2/2014 | Sabouri | H01Q 1/50 |
| | | | 343/860 |
| 2014/0187284 A1 | 7/2014 | Sanchez et al. | |
| 2015/0035617 A1* | 2/2015 | Leipold | H03H 7/465 |
| | | | 333/132 |
| 2015/0381171 A1* | 12/2015 | Cebi | H03K 17/687 |
| | | | 327/427 |
| 2017/0070199 A1* | 3/2017 | Anderson | B82Y 10/00 |
| 2017/0110451 A1* | 4/2017 | Fraser | H01L 27/085 |
| 2017/0250728 A1* | 8/2017 | Afsahi | H04B 1/44 |

\* cited by examiner

US 10,333,579 B1

MULTI-MODE CONFIGURABLE TRANSCEIVER WITH LOW VOLTAGE SWITCHES

FIELD OF THE INVENTION

Embodiments of the present invention relate to radio frequency (RF) transceivers, and more particularly to a RF transceiver having different output power configurations.

BACKGROUND OF THE INVENTION

Advances in wireless technology enable wireless communication devices to support signal transmission and reception over multiple frequency bands and communication standards. For example, a cellular phone may be able to communicate using WCDMA, CDMA, GSM, LTE standards for cellular telephony, IEEE 802.11 protocols for wireless LAN, and/or Bluetooth Low Energy (BLE) for piconet wireless communication.

FIG. 1 is a block diagram of a prior art wireless transceiver device 100. Referring to FIG. 1, a radio frequency (RF) input signal 111 is provided to a low power amplifier 110, which outputs an amplified output signal 113 to an antenna 150 through a port 161 of an external switch device 160 for wireless transmission. Transceiver device 100 also includes a high power amplifier 120 which receives an RF input signal 121 and outputs an amplified output signal 123. Transceiver device 100 also includes a balun 125. Output signal 123 is a differential signal coupled to a balun primary winding 125$p$. Balun 125 transforms the differential signal 123 to a single-ended signal 126 through a secondary winding 125$s$ that is provided to antenna 150 through a port 162 of switch device 160. Transceiver device 100 also includes a low noise amplifier 140 for receiving a RF input signal of antenna 141 through a port 163 of switch device 160. Referring to FIG. 1, switch device 160 may be a four-port device having four ports 161, 162, 163, and 164. Switch device 160 may be implemented utilizing electronic switches such as MOS transistors.

However, an external (i.e., off-chip) switch device may increase the printed circuit board area, power consumption, and the manufacturing costs that are not suitable for high volume and low cost production of wearable wireless devices.

Embodiments of the present invention provide novel solutions to these problems.

BRIEF SUMMARY OF THE INVENTION

An aspect of the present invention provides a wireless transceiver including a receive path having a first switch and configured to receive an input signal when the first switch is in an open position, a first transmit path having a second switch and configured to provide a first output signal when the second switch is in a closed position and the first switch is in a closed position, and a second transmit path having a third switch and configured to provide a second output signal when the third switch is in a closed position, the first switch is in the closed position, and the second switch is in an open position. The first, second, and third switches are integrated together with the receive path, the first RF transmit path, and the second transmit path within a same integrated circuit.

Another aspect of the present invention provides a configurable transceiver having a receive path comprising a low noise amplifier (LNA) having an input terminal coupled to an antenna, a first switch being coupled to the input terminal of the LNA and a ground potential, a first transmit path comprising a low power amplifier having an output terminal coupled to the antenna through the second switch, and a second transmit path comprising a high power amplifier having an output terminal coupled to a balun having a primary winding and a secondary winding, a third switch is coupled between an end terminal of the secondary winding and a ground potential.

Yet another aspect of the present invention provides a method of configuring a wireless transceiver comprising a receive path having a first switch, a first transmit path having a second switch, and a third transmit path having a third switch. The method may include selecting the receive path by setting the first switch in an open position, the second switch in the open position, and the third switch in the open position, selecting the first transmit path by setting the first switch in a closed position, the second switch in the closed position, and the third switch in the open position, and selecting the second transmit path by setting the first switch in a closed position, the second switch in the open position, and the third switch in the closed position.

The following description, together with the accompanying drawings, will provide a better understanding of the nature and advantages of the claimed invention.

BRIEF DESCRIPTION OF THE DRAWINGS

The accompanying drawings, which are incorporated in and constitute a part of the specification, illustrate embodiments of the present invention. The like reference labels in various drawings refer to the like elements.

DETAILED DESCRIPTION OF THE INVENTION

The present invention will be understood more fully from the detailed description given below and from the accompanying drawings of the preferred embodiments of the invention, which, however, should not be taken to limit the invention to the specific embodiments, but are for explanation and understanding only. The embodiments are described in sufficient detail to enable one of skill in the art to practice the invention. Other embodiments may be utilized and structural, logical, and electrical changes may be made without departing from the scope of the present invention.

It will be understood that, when an element or component is referred to as "adjacent to," "connected to," or "coupled to" another element or component, it can be directly adjacent to, connected or coupled to the other element or 1 component, or intervening elements or components may also be present. In contrast, when an element is referred to as being "directly connected to," or "directly coupled to" another element or component, there are no intervening elements or components present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items. As used herein, the term "radio frequency", "RF," and "wireless" are interchangeably used.

Figure 1:
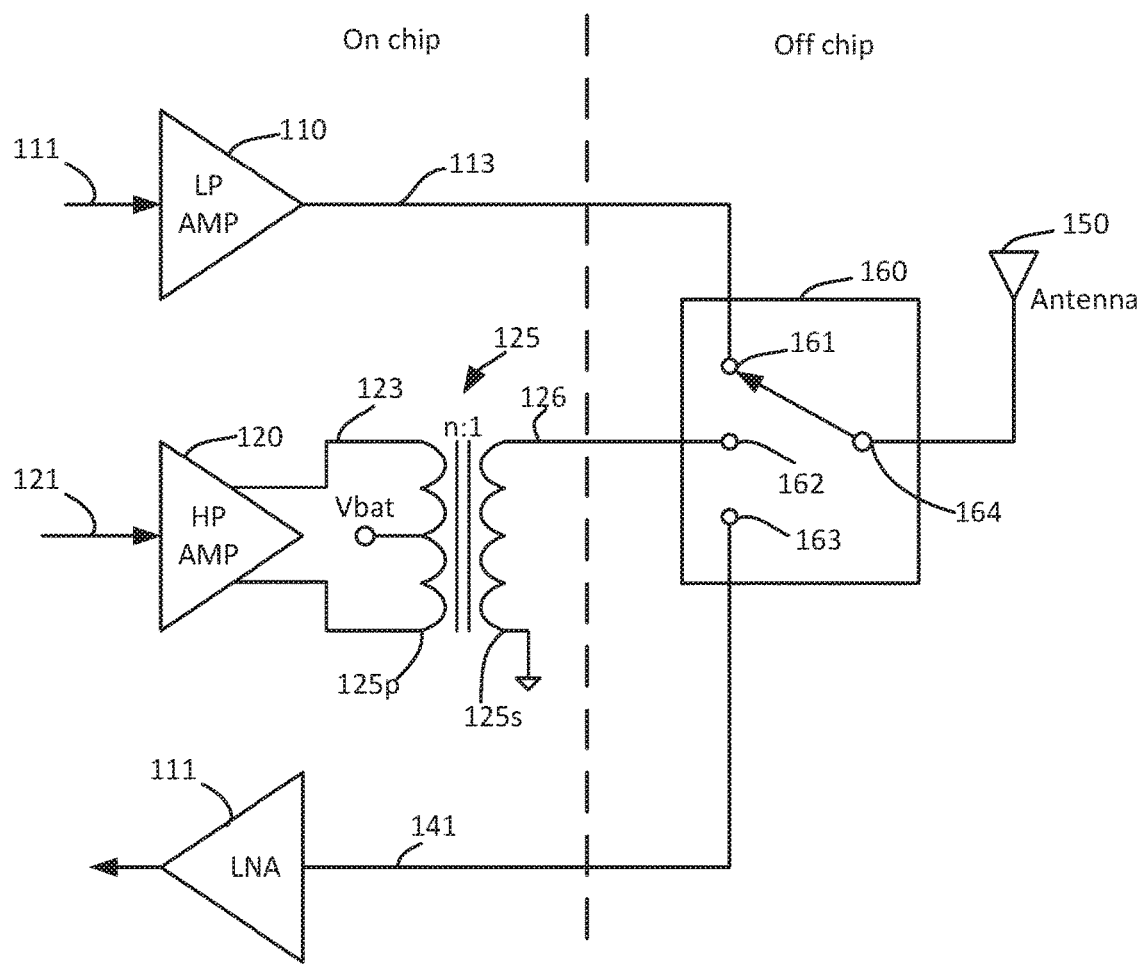
FIG. 1 is a block diagram of a prior art wireless transceiver device.
Figure 2:
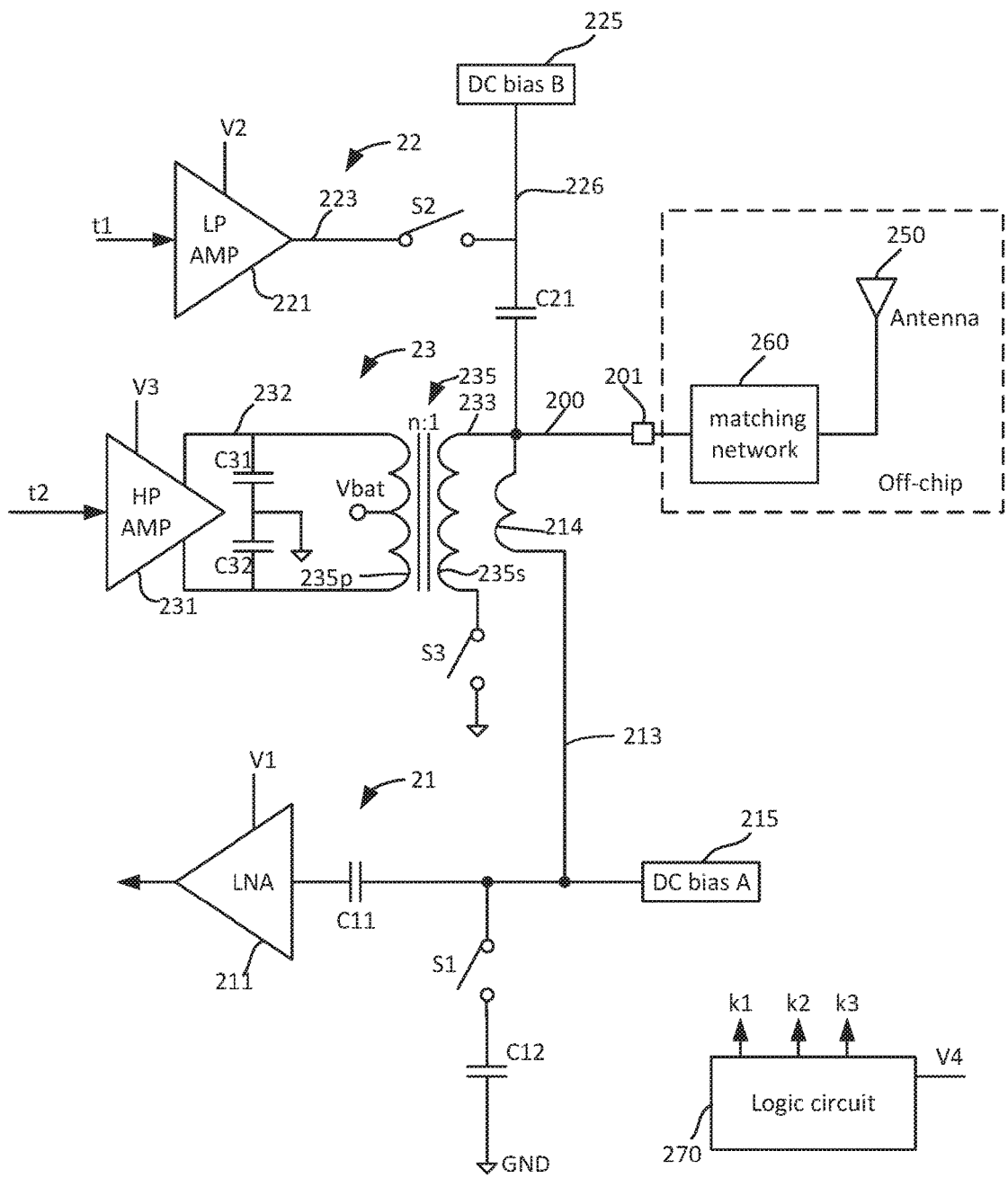
FIG. 2 is a block diagram of a radio frequency (RF) transceiver according to an embodiment of the present invention.

FIG. 2 is a block diagram of a radio frequency (RF) transceiver 20 according to an embodiment of the present invention. Referring to FIG. 2, transceiver 20 may include a receive path 21, a first RF transmit path 22, and a second transmit path 23. Transceiver 20 may further include a logic circuit 270 configured to provide control signals to activate or deactivate receive path 21, first RF transmit path 21, and second transmit path 23. Receive path 21, first RF transmit path 22, and second transmit path 23 are connected to each other by a main signal path 200 that may terminate at a node 201. Node 201 may be a pin, pad, or bump of an integrated circuit and coupled to an external (off-chip) antenna 250 via an external matching network 260.

Receive path 21 may include a low noise amplifier (LNA) 211 configured to receive a RF input signal 213 from antenna 250 through an ac coupling capacitor C11. Receive path 21 may also include a first switch S1 coupled between one end of coupling capacitor C11 and one end of a first DC block capacitor C12. First DC block capacitor C12 has another end coupled to a ground potential GND. Receive path 21 may further include a direct current (DC) bias circuit A 215 configured to provide a bias voltage to LNA 211. In one embodiment, LNA 211 may have an internal DC bias circuit, in this case DC bias circuit 215 may be omitted. In one embodiment, receive path 21 may also include an LNA impedance matching inductor 214.

First RF transmit path 22 may include a low power amplifier (LP AMP) 221, a second switch S2, and a second DC block capacitor C21 having one end coupled to main signal path 200 and another end coupled to one end of second switch S2. Second switch S2 has another end coupled to an output of LP AMP 221. LP AMP 221 receives a RF first input signal t1 and provides an amplified output signal 223. First RF transmit path 22 may further include a second DC bias circuit 225 coupled to second switch S2 and configured to provide a DC bias voltage to output signal 223 when second switch S2 is in a closed position. First RF transmit path 22 may also include a DC bias circuit 225 configured to provide a bias voltage 226 to output signal 223 when second switch is in the closed position. Bias voltage 226 is blocked by DC block capacitor C21 so that only output signal 223 reaches main signal path 200. In one embodiment, the low power amplifier may have an internal bias voltage or current so that DC bias circuit B 225 may be omitted.

Second RF transmit path 23 may include a high power amplifier (HP AMP) 231 and a balun 235 having a primary winding 235$p$ and a secondary winding 235$s$. Primary winding 235$p$ has a tap connected to a power supply Vbat. Secondary winding 235$s$ is electromagnetically coupled to primary winding 235$p$ and has one end coupled to main signal path 200 and another end coupled to the ground potential GND through a third switch S3. HP AMP 231 is configured to receive a signal t2 and output an amplified output differential signal 232 to balun 235. Balun 235 is configured to convert differential signal 232 to a single-ended signal 233 and provide to node 201. In one embodiment, single-ended signal 233 of secondary winding 235$s$ of balun 235 can directly drive antenna 250 without an additional power amplification stage.

In one embodiment, transceiver 20 may further includes two switchable capacitors C31, C32 coupled in parallel to primary winding 235$p$ in order to obtain s switchable high input impedance of balun 235.

In one embodiment, transceiver 20 may also include an off-chip matching network 260 coupled between node 201 and antenna 250. Matching network 260 is configured to match an output impedance of HP AMP 231 to an impedance of a load, i.e., antenna 250.

In some embodiments, receive path 21 has a first power supply voltage V1, first transmit path 22 has a second power supply voltage V2, and second transmit path 23 has a third power supply voltage V3. Transceiver 20 may be an integrated circuit having a core region that is supplied by a fourth supply voltage V4. For example, the core region may include core transistors and pass gate transistors that are operating at the fourth supply voltage V4. First transmit path 22 and second transmit path 23 each may have transistors in the peripheral region of the integrated circuit, the transistors in the peripheral region may have a gate oxide layer thickness thicker than the gate oxide thickness of the transistors of the receive path. In one embodiment, V4<V1<V2<V3. For example, the supply voltage V4 of the core region including logic circuit 270 may be about 0.9V, the supply voltage V1 of the receive path including the LNA may be 1-1.2V, the supply voltage V2 of the first transmit path including the LP AMP may be about 1.8V, and the supply voltage V3 of the second transmit path including the HP AMP may be about 3.3V. In one embodiment, the voltage Vbat applied to the center tap of the primary winding of the balun is about 3.3V, i.e., the same as V3.

As used herein, low voltage MOS transistors (e.g., FETs) are referred to as transistors having a thin gate oxide layer (on the order of 2.6 nm thick), whereas high voltage FET are referred to transistors that are fabricated with a thicker gate oxide (on the order of 5.6 nm thick). Additionally, the high voltage FETs have a longer channel length of 250 nm or more, vs. 40 nm for a low voltage FET (in 40 nm process). Low voltage FETs (also referred to as core FETs) constitute the largest portion of the chip functionality. High voltage FETs (also referred to as IO FETs) are predominantly used for Input and Output signals. The low voltage FET has a far superior Figure of Merit, defined as FOM=RDS×CGS (lower is better); lower on-resistance and lower parasitic capacitance. It is highly favorable to implement a switch using a low voltage FET provided it can be assured that it remains within its safe operating voltage.

Switches S1 and S3 are low voltage n-type field effect transistors (nFETs) whereas switch S2 is a high voltage IO n-type field effect transistors (nFET). In the following, a switch being in a closed (open) position is referred to as the nFET is in a "turned on" or "conducting" ("turned off" or "non-conducting") state.

Logic circuit 270 is configured to generate control signals to set switches S1, S2, and S3 to their respective positions, e.g., closed position, and open position. Logic circuit 270 may include digital logic gates (e.g., inverters, NAND, NOR, and/or XOR gates) or a microcontroller, microprocessor, programmable logic array, and/or field programmable logic.

Transceiver 20 may be operated in a variety of operating modes. In one embodiment, transceiver 20 may be operated in a receive mode. In the receive mode, logic circuit 270 provides a first control signal k1 to set (actuate) first switch S1 to an open position, a second control signal k2 to set second switch S2 to the open position, and a third control signal k3 to set third switch to the open position. In one embodiment, transceiver 20 may be operated in a first transmission mode. In the first transmission mode, logic circuit 270 provides first control signal k1 to set first switch S1 to a closed position, second control signal k2 to set second switch S2 to the closed position, and third control signal k3 to set third switch to the open position. In one embodiment, transceiver 20 may be operated in a second transmission mode. In the second transmission mode, logic circuit provides first control signal k1 to set first switch S1 to the closed position, second control signal k2 to set second switch S2 to the open position, and third control signal k3 to set third switch to the closed position.

These configurations of the transceiver have important advantages in terms of electrical performance and high level of integration. As explained in the background section, a high drain-to-source voltage could exceed the breakdown voltage of the transistors used for S1 and S3. Therefore, both the first switch (e.g., nFET) S1 and the third switch (e.g., nFET) S3 are in the open position when the high power transmit path is not in use. When the high power transmit path is in use, the first switch S1 and the third switch S3 (nFET) are conducting, lowering the risk of a breakdown of the nFETs.

It will be appreciated by those of ordinary skill in the art that the components in first transmit path 22 and second transmit path 23 are shown for illustrative purpose only, and that first transmit path 22 and second transmit path 23 may be implemented using any alternative architectures. For example, the low power amplifier and the high power amplifier in the respective first transmit path and the second transmit path may have one or more amplification stages. The configurations and techniques of the present invention can be applied to such alternative architectures.

In one embodiment, input signal 213 to LNA 211 is a single-ended signal, output signal 223 provided at an output of LP AMP 221 is a single-ended output signal, and output signal 232 provided at an output of HP AMP 231 is a differential signal. In one embodiment, LNA 211 is supplied with a first supply voltage V1, LP AMP 221 is supplied with a second supply voltage V2, HP AMP 231 is supplied with a third supply voltage V3, and logic circuit 270 is supplied with a second supply voltage V4. In one embodiment, V4<V1<V2<V3. In one embodiment the voltage Vbat at the center tap of primary winding 235p of balun 235 is equal to V3.

Figure 2A:
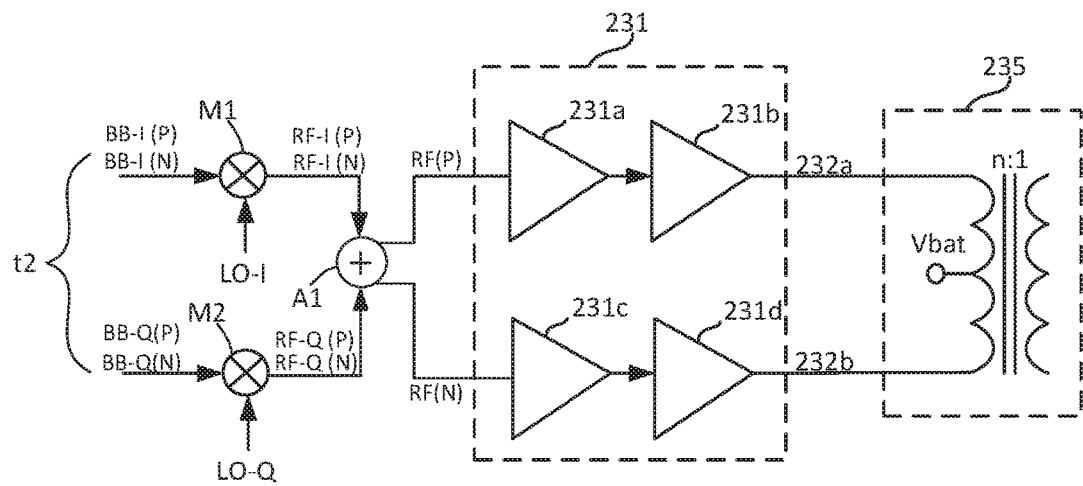
FIG. 2A is a block diagram of a transmit signal of the second transmit path according to an exemplary embodiment of the present invention.

FIG. 2A is a block diagram of a transmit signal of the second transmit path according to an exemplary embodiment of the present invention. Referring to FIG. 2A, a t2 signal may include an input baseband signal BB-I (in-phase) and an input baseband signal BB-Q (quadrature-phase) provided to respective mixers M1 and M2 which up-convert the BB-I and BB-Q baseband signals to respective radio frequency (RF) signals RF-I and RF-Q by multiplying them with respective local oscillator signals LO-I and LO-Q. The up-converted RF signals RF-I and the RF-Q are then summed at an adder A1, and the summed signals are provided to HP AMP 231. It is noted that the baseband signals may be differential signals that are mixed with differential local oscillator frequency signals. The summed signals are also differential signals that are provided to HP AMP 231. In one example embodiment, HP AMP 231 may include a pre-driver 231a and an amplifier 231b, and a pre-driver 231c and an amplifier 231d. Positive and negative differential signal outputs of adder A1 are coupled to respective pre-drivers 231a and 231c. Amplifiers 231b and 231d increase the pre-amplified output signals of pre-drivers 232a, 232b to the required power level by the wireless standard to deliver differential signals 232a, 232b to balun 235.

Figure 2B:
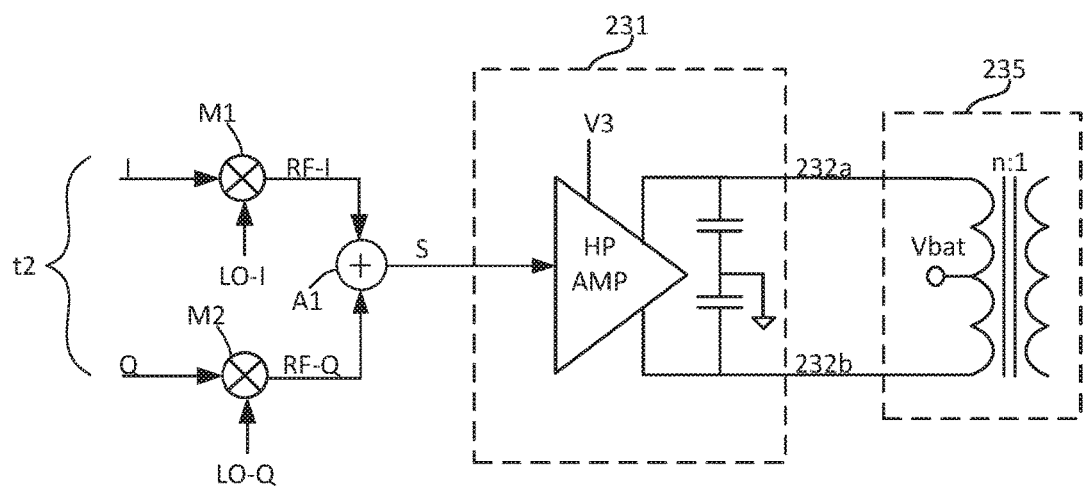
FIG. 2B is a block diagram of a transmit signal of the second transmit path according to another exemplary embodiment of the present invention.

FIG. 2B is a block diagram of a transmit signal of the second transmit path according to another exemplary embodiment of the present invention. Referring to FIG. 2B, a t2 signal may include an in-phase signal I and a quadrature-phase signal Q that are frequency up-converted to respective RF-I and RF-Q by respective mixers M1 and M2. The up-converted RF-I and the RF-Q signals are summed at an adder A1 to a real signal S, which is then applied to HP AMP 231. In one embodiment, the real signal S may be a single-ended signal. In other embodiment, the real signal S is a differential signal. HP AMP 231 provides than a differential signal 232a, 232b to balun 235.

Figure 3A:
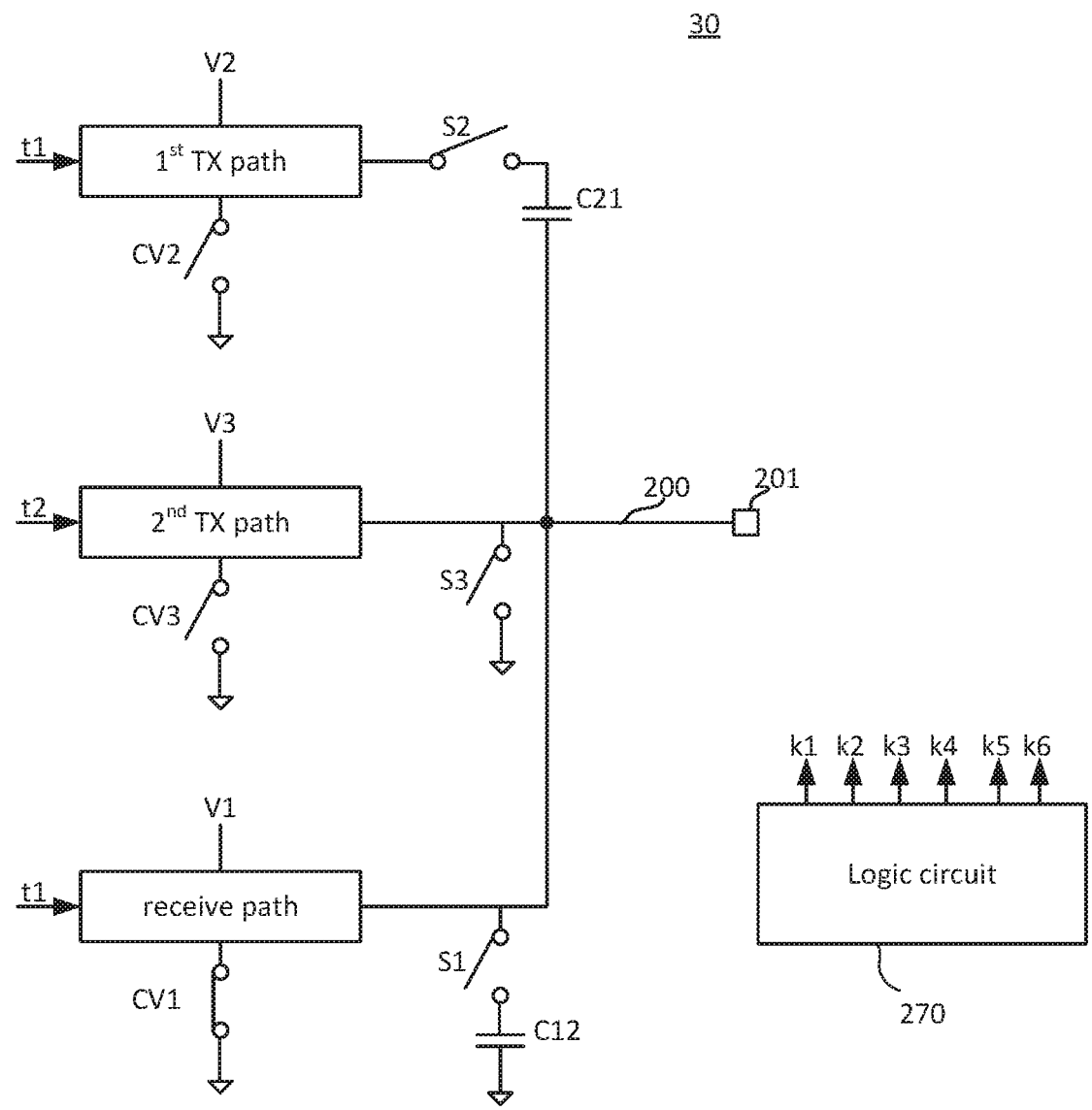
FIG. 3A is a simplified block diagram illustrating a receive operation of a transceiver 30 according one embodiment of the present invention.

FIG. 3A is a simplified block diagram illustrating a receive operation of a transceiver 30 according one embodiment of the present invention. Referring to FIG. 3A, transceiver 30 may have a similar implementation as transceiver 20 of FIG. 2. Transceiver 30 may include a receive path 31 that is supplied with a first power supply voltage V1, and a first switch S1 coupled between an input terminal of receive path 31 (e.g., an input of LNA 211) and GND via capacitor C12. Transceiver 30 may also include a first transmit path 32 that is supplied with a second power supply voltage V2, and a second switch S2 coupled between an output of first transmit path 32 (e.g., an output of LP AMP 221) and main signal path 200 via capacitor C21. Transceiver 30 may also include a second transmit path 33 that is supplied with a third power supply voltage V3, and a third switch S3 coupled between an output of second transmit path 33 (e.g., an output of HP AMP 231) and GND. During the receive operation, first switch S1 is in an open position, second switch S2 is in the open position, and third switch S3 is in the open position. The power supply voltages V1, V2, V3 may be disconnected from the respective receive path, the first transmit path, and the second transmit path through associated switches SV1, SV2, and SV3. Transceiver 30 may include logic circuit 270 configured to generate a plurality of control signals to set the operation modes of transceiver 30. Accordingly, logic circuit 270 generates control signals k1, k2, and k3 to set switches S1, S2, and S3 to their respective positions, e.g., closed position, and open position to set transceiver 30 to the desired operation mode (e.g., receive mode, first signal transmission using the first transmit path, and second signal transmission using the second transmission path). Logic circuit 270 may also be configured to generate control signals (e.g., kv1, kv2, kv3) to connect and disconnect the power supply voltages to the corresponding receive path, the first transmit path, and the second transmit path through respective switches CV1, CV2, and CV3.

Figure 3B:
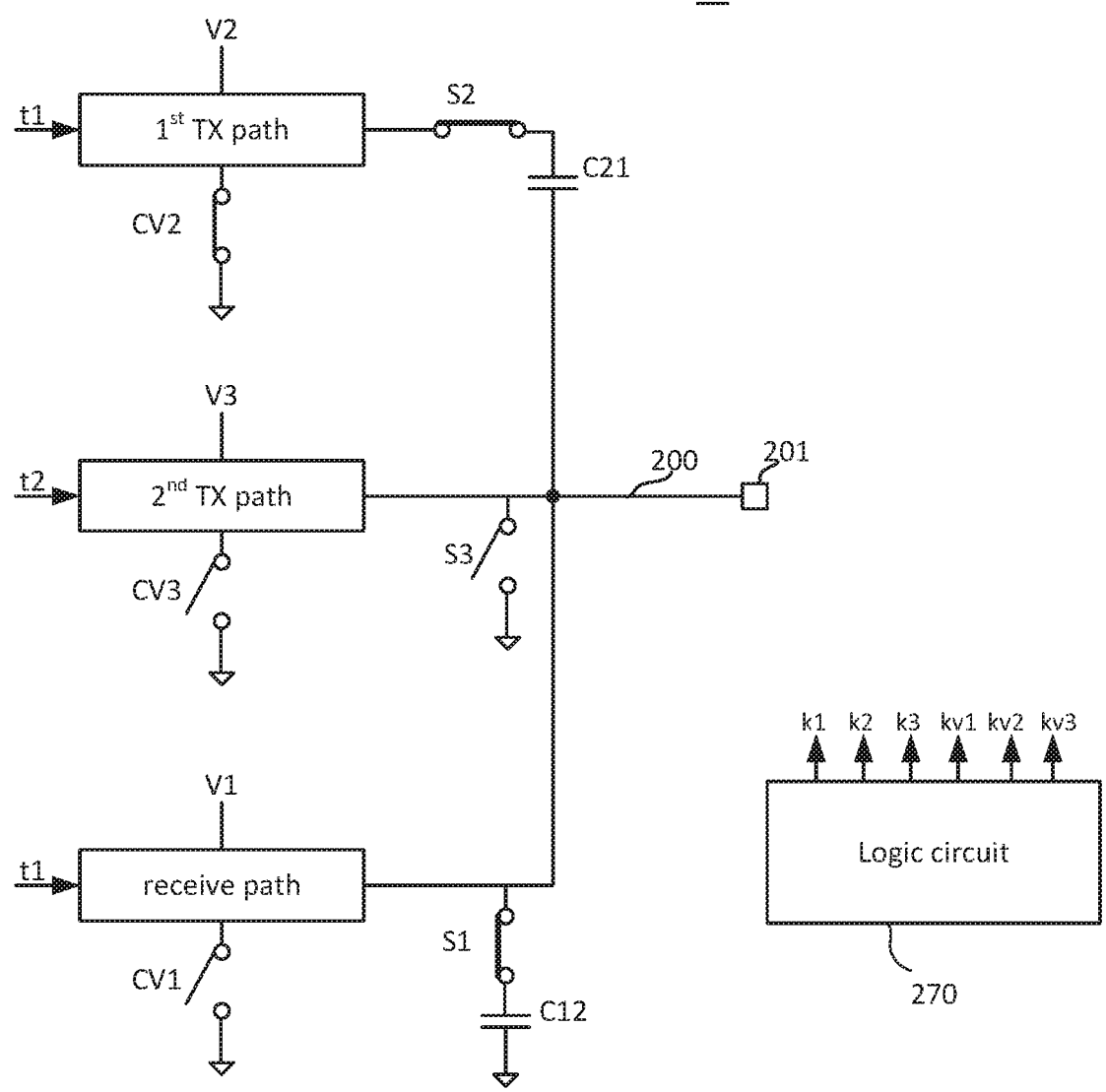
FIG. 3B is a simplified block diagram illustrating a first transmit operation of a transceiver according one embodiment of the present invention.

FIG. 3B is a simplified block diagram illustrating a first transmit operation of transceiver 30 according one embodiment of the present invention. FIG. 3B is the same as FIG. 3A with the exception that transceiver 30 is now in the first transmit operation where the first transmit path is active, and the second transmit path and the receive path are inactive. During the first transmit operation, first switch S1 is in a closed position, second switch S2 is in the closed position, and third switch S3 is in the open position.

Figure 3C:
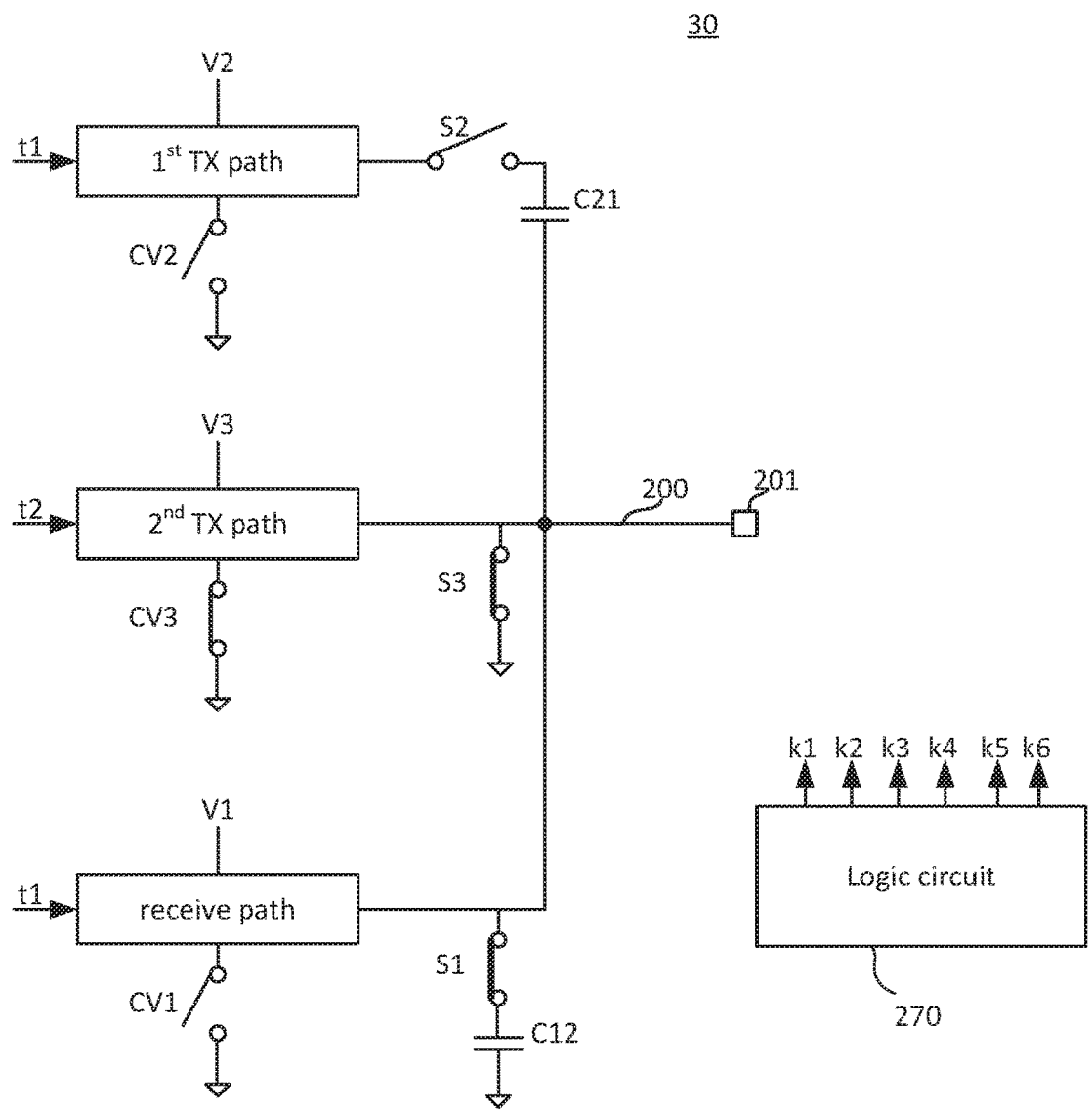
FIG. 3C is a simplified block diagram illustrating a second transmit operation of a transceiver according one embodiment of the present invention.

FIG. 3C is a simplified block diagram illustrating a second transmit operation of transceiver 30 according one embodiment of the present invention. FIG. 3C is the same as FIG. 3A with the exception that transceiver 30 is now in the second transmit operation where the second transmit path is active, and the first transmit path and the receive path are inactive. During the second transmit operation, first switch S1 is in a closed position, second switch S2 is in the open position, and third switch S3 is in the closed position.

It is understood that the number of transmission paths and the number of receive paths can be any integer number. In the example embodiments shown in FIG. 2 and FIGS. 3A through 3C, the RF transceiver includes two transmit paths (low power transmit path and high power transmit path) and one receive path. But it is understood that the number of transmit paths and the number of receive path are arbitrarily chosen for describing the example embodiment and should not be limiting.

Figure 4:
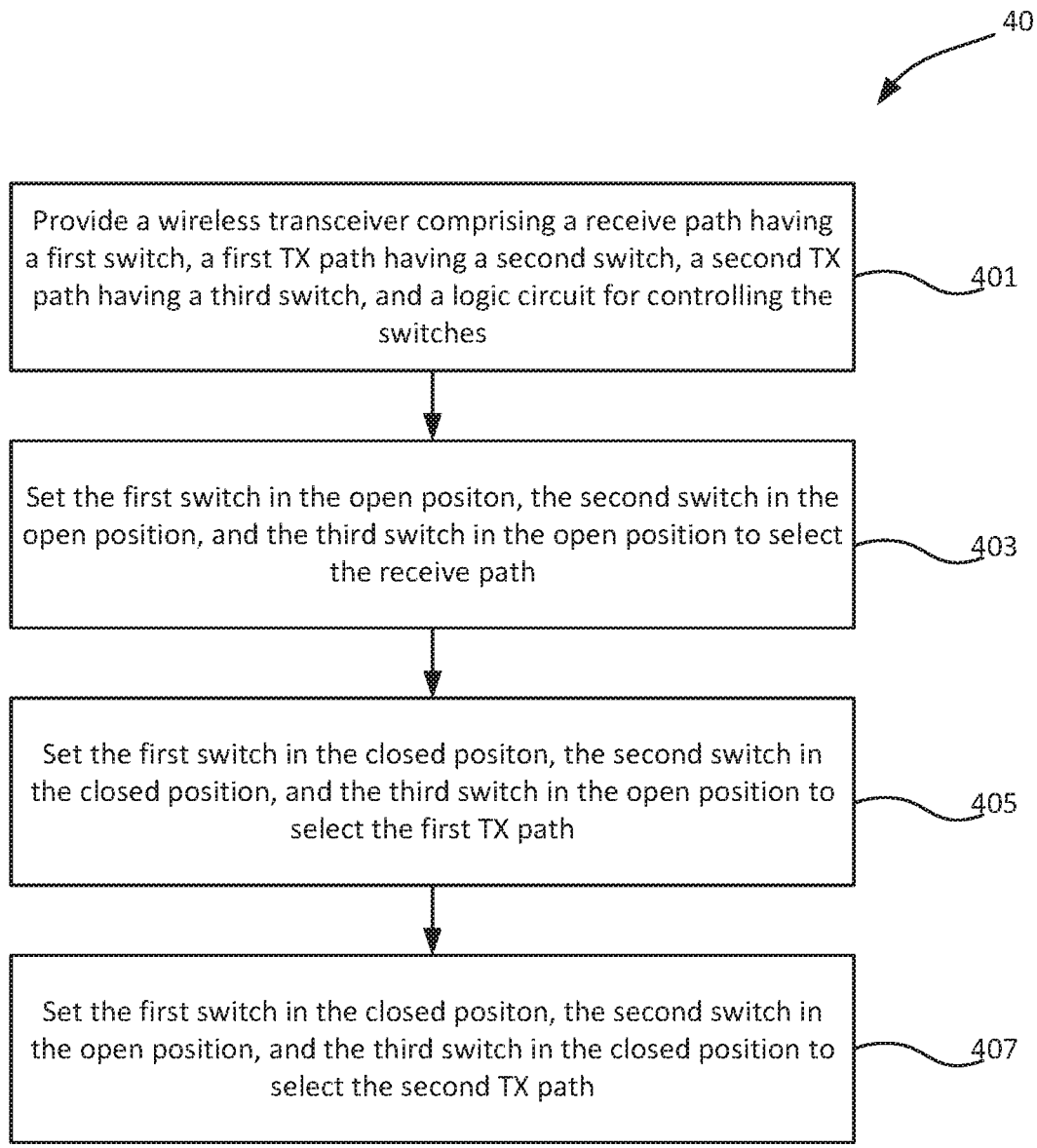
FIG. 4 is a simplified flow chart of a method for operating a RF transceiver according to an embodiment of the present invention.

FIG. 4 is a simplified flow chart of a method 40 for operating a RF transceiver according to an embodiment of the present invention. It is understood that method 40 is only illustrative and not intended to limit the scope of the present invention to any embodiment shown.

Referring to FIG. 4, method 40 may include, at step 401, providing a configurable radio frequency (RF) transceiver comprising a receive path having a first switch, a first transmit path having a second switch, and a second transmit path having a third switch, and a logic circuit configured to generate control signals to set the switches to an open position or a closed position. The receive path includes a low noise amplifier, the first transmit path includes a low power amplifier, and the second transmit path includes a high power amplifier. The first, second, and third switches integrated together with the receive and first and second transmit paths within a same integrated circuit. Method 40 may include selecting one of the receive path, the first transmit path, and the second transmit path. At step 403, when the receive path is desired and selected, method 40 includes setting the first switch in the open position, the second switch in the open position, and the third switch in the open position. That is, during the receive operation, the first, second, and third switches are open. In one embodiment, the power supply voltages to the respective first transmit path and the second transmit paths are disconnected through respective switches. In one embodiment, the switches are low voltage n-type MOS field effect transistors (nMOSFET) that are turned off.

At step 405, when the first transmit path is desired and selected, method 40 includes setting the first switch in the closed position, the second switch in the closed position, and the third switch in the open position. That is, during the transmission operation with the first transmit path, the first switch and the second switch are closed (the associated FETs are turned on), and the third switch is open (the associated FET is turned off).

At step 407, when the second transmit path is desired and selected, method 40 includes setting the first switch in the closed position, the second switch in the open position, and the third switch in the closed position. That is, during the transmission operation with the second transmit path, the first switch is closed (the associated FET is turned on), the second switch is open (the associated FET is turned off), and the third switch is closed (the associated FET is turned on).

Figure 5:
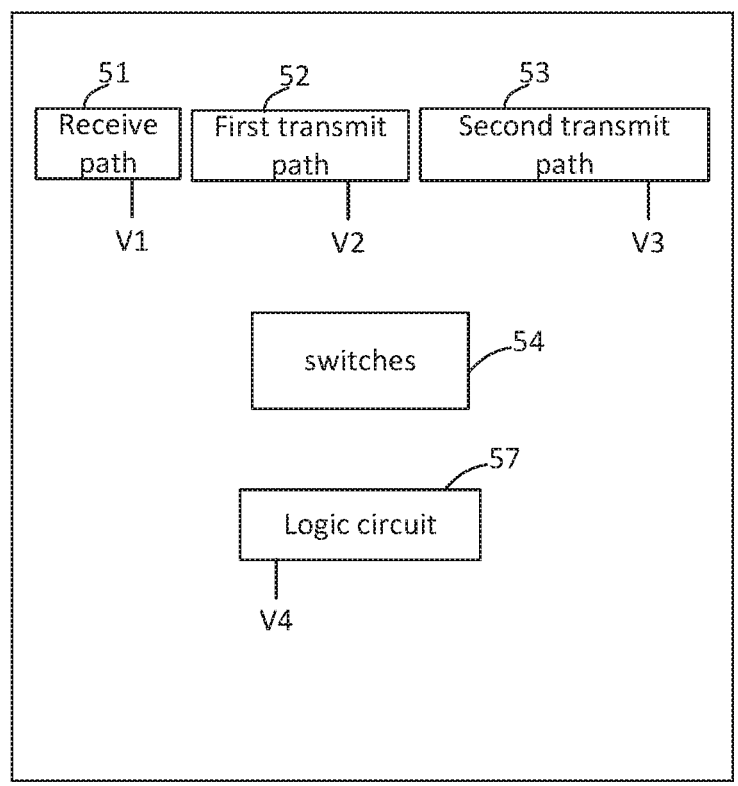
FIG. 5 is a plan view of an example layout of a multi-mode wireless transceiver according to an embodiment of the present invention.

FIG. 5 is a plan view of an example layout of a multimode wireless transceiver device 50 according to an embodiment of the present invention. Referring to FIG. 5, wireless transceiver device 50 may include a receive path 51, a first transmit path 52, and a second transmit path 53. Receive path 51 may include a low noise amplifier LNA and a first switch, first transmit path 52 may include a low power amplifier LP AMP and a second switch, and second transmit path 53 may include a high power amplifier HP AMP, a balun, and a third switch, as described in the sections above in connection with FIGS. 2, 2A, 2B, and FIGS. 3A through 3C. In one embodiment, receive path 51 receives a power supply voltage V1, first transmit path 52 receives a power supply voltage V2, third transmit path receives a power supply voltage V3, and logic circuit 57 receives a power supply voltage V4. In one embodiment, $V4<V1<V2<V3$. In one example embodiment, the supply voltage V4 of the core region including logic circuit 270 may be about 0.9 to 1V, the supply voltage V1 of the receive path including the LNA may be 1-1.1V, the supply voltage V2 of the first transmit path including the LP AMP may be about 1.8V, the supply voltage V3 of the second transmit path including the HP AMP may be about 3.3V, and the supply voltage of the logic circuit is about 1V and level shifted where needed. In one embodiment, the logic circuit is configured to generate control signals for enabling or disabling the receiving and transmitting functions of the transceiver as described in the above sections.

Although specific embodiments have been illustrated and described herein, it will be appreciated by those of ordinary skill in the art that any arrangement that is derived to achieve the same purpose may be substituted for the specific embodiments shown. Many modifications of the invention will be apparent to those of ordinary skill in the art. Accordingly, this disclosure is intended to cover any modifications or variations of the invention. It is intended that this invention be limited only by the following claims and their equivalents.

What is claimed is:

1. A configurable radio frequency (RF) transceiver comprising:
   a radio frequency (RF) receive path having a first switch and configured to receive a RF input signal when the first switch is in an open position;

a first RF transmit path having a second switch and configured to provide a first output signal when the second switch is in a closed position and the first switch is in a closed position; and a second RF transmit path having a third switch and configured to provide a second output signal when the third switch is in a closed position, the first switch is in the closed position, and the second switch is in an open position, the second RF transmit path comprising a balun having a primary winding and a secondary winding having a first end coupled to the first RF transmit path through a capacitor and a second end coupled to a ground potential through the third switch, wherein the first switch, the second switch, and the third switch are integrated together with the RF receive path, the first RF transmit path, and the second RF transmit path within a same integrated circuit.

2. The RF transceiver of claim 1, further comprising:
a logic circuit configured to generate a plurality of control signals for setting the first switch, the second switch, and the third switch between their respective closed position and the open position.

3. The RF transceiver of claim 2, wherein the plurality of control signals select the RF receive path, the first RF transmit path, and the second RF transmit path based on operating modes of the RF transceiver.

4. The RF transceiver of claim 2, wherein:
the RF receive path is powered by a first power source;
the first RF transmit path is powered by a second power source;
the second RF transmit path is powered by a third power source;
when the RF receive path is selected, the plurality of control signals disconnect the second power source of the first RF transmit path and the third power source of the second RF transmit path;
when the first RF transmit path is selected, the plurality of control signals disconnect the first power source of the RF receive path and the third power source of the second RF transmit path; and
when the second RF transmit path is selected, the plurality of control signals disconnect the first power source of the RF receive path and the second power source of the first RF transmit path,
wherein a voltage potential of the first power source is lower than a voltage potential of the second power source, and the voltage potential of the second power source is lower than a voltage potential of the third power source.

5. The RF transceiver of claim 1, wherein the first RF transmit path comprises a low-power amplifier having an input configured to receive a first signal and an output configured to output an amplified first single-ended signal.

6. The RF transceiver of claim 1, wherein the second RF transmit path comprises:
a high-power amplifier having an input configured to receive a second signal and an output configured to output a second amplified differential signal to the balun which transforms the second amplified differential signal to an amplified second single-ended signal.

7. The RF transceiver of claim 6, wherein the primary winding of the balun is coupled to the output of the high-power amplifier and comprises a tap coupled to a power source of the high-power amplifier.

8. The RF transceiver of claim 1, wherein the RF receive path comprises a low-noise amplifier (LNA) having an input coupled to the first end of the secondary winding through a matching inductor.

9. The RF transceiver of claim 8, wherein the matching inductor is a part of the balun.

10. The RF transceiver of claim 1, wherein each of the first, second, and third switches is a low-voltage n-type metal oxide semiconductor field effect transistor (nMOSFET) in a core region of the integrated circuit.

11. A wireless transceiver comprising:
a receive path having a first switch and configured to receive an input signal when the first switch is in an open position;
a first transmit path having a second switch and configured to provide a first output signal when the second switch is in a closed position and the first switch is in a closed position;
a second transmit path having a third switch and configured to provide a second output signal when the third switch is in a closed position, the first switch is in the closed position, and the second switch is in an open position; and
a balun comprising a primary winding coupled to the second transmit path and a secondary winding having a first end coupled to the first transmit path through a capacitor and a second end coupled to a ground potential through the third switch.

12. The wireless transceiver of claim 11, wherein:
the receive path comprises a low noise amplifier (LNA) having an input terminal coupled to an antenna, the first switch being disposed between the input terminal of the LNA and the ground potential;
the first transmit path comprises a low power amplifier having an output terminal coupled to the antenna through the second switch and the capacitor; and
the second transmit path comprises a high power amplifier having an output terminal configured to output a differential signal to the primary winding, and the secondary winding transforms the differential signal into a single-ended signal to the antenna.

13. The wireless transceiver of claim 11, further comprising a logic circuit configured to generate a plurality of control signals to the first switch, the second switch, and the third switch.

14. The wireless transceiver of claim 13, wherein the LNA, the low power amplifier, the high power amplifier, the logic circuit, the first switch, the second switch, and the third switch are integrated within a same integrated circuit.

15. The wireless transceiver of claim 14, wherein the LNA, the low power amplifier, and the high power amplifier are disposed in a peripheral region of the integrated circuit; and the logic circuit, the first switch, the second switch, and the third switch are disposed in a core region of the integrated circuit.

16. A method of configuring a wireless transceiver comprising a receive path having a first switch, a first transmit path having a second switch, and a second transmit path having a third switch, the method comprising:
providing a balun to the second transmit path, the balun comprising a primary winding and a second winding having a first end coupled to the first transmit path through a capacitor and a second end coupled to a ground potential through the third switch;
selecting the receive path by setting the first switch in an open position, the second switch in the open position, and the third switch in the open position;

selecting the first transmit path by setting the first switch in a closed position, the second switch in the closed position, and the third switch in the open position; and selecting the second transmit path by setting the first switch in a closed position, the second switch in the open position, and the third switch in the closed position.

17. The method of claim 16, further comprising:

generating a plurality of control signals by a logic circuit for setting the first switch, the second switch, and the third switch between the closed position and the open position.

18. The method of claim 17, wherein the logic circuit determines an operation mode of the transceiver by selecting the receive path, the first transmit path, and the second transmit path.

19. The method of claim 17, wherein:

the receive path is powered by a first power source;

the first transmit path is powered by a second power source;

the second transmit path is powered by a third power source;

selecting the receive path comprises disconnecting the second power source of the first transmit path and the third power source of the second transmit path by the plurality of control signals;

selecting the first transmit path comprises disconnecting the first power source of the receive path and the third power source of the second transmit path by the plurality of control signals; and selecting the second transmit path comprises disconnecting the first power source of the receive path and the second power source of the first transmit path by the plurality of control signals.

20. The method of claim 17, wherein the receive path, the first transmit path, the second transmit path, the logic circuit, the first switch, the second switch, and the third switch are integrated in a same integrated circuit.

* * * * *